(12) United States Patent
Guo et al.

(10) Patent No.: US 9,087,811 B2
(45) Date of Patent: Jul. 21, 2015

(54) SELF ALIGNED EMBEDDED GATE CARBON TRANSISTORS

(71) Applicant: INTERNATIONAL BUSINESS MACHINES CORPORATION, Armonk, NY (US)

(72) Inventors: Dechao Guo, Fishkill, NY (US); Shu-Jen Han, Cortlandt Manor, NY (US); Yu Lu, Hopewell Junction, NY (US); Keith Kwong Hon Wong, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 56 days.

(21) Appl. No.: 13/969,013

(22) Filed: Aug. 16, 2013

(65) Prior Publication Data

US 2014/0312413 A1 Oct. 23, 2014

Related U.S. Application Data

(63) Continuation of application No. 13/864,760, filed on Apr. 17, 2013.

(51) Int. Cl.
*H01L 29/66* (2006.01)
*H01L 29/417* (2006.01)
*H01L 29/778* (2006.01)
*H01L 29/16* (2006.01)
*H01L 51/00* (2006.01)
*H01L 51/05* (2006.01)

(52) U.S. Cl.
CPC .... *H01L 29/41741* (2013.01); *H01L 29/41775* (2013.01); *H01L 29/66045* (2013.01); *H01L 29/778* (2013.01); *H01L 29/1606* (2013.01); *H01L 51/0048* (2013.01); *H01L 51/0545* (2013.01)

(58) Field of Classification Search
CPC ............... H01L 29/66765; H01L 51/0545; H01L 29/4236; H01L 29/66704; H01L 27/088; H01L 29/084
USPC .......... 257/330, E29.201, E29.116, 288, 368, 257/369; 438/315, 334, 151, 197, 199, 259
See application file for complete search history.

(56) References Cited

U.S. PATENT DOCUMENTS

| | | | |
|---|---|---|---|
| 6,891,227 B2 | 5/2005 | Appenzeller et al. | |
| 7,115,916 B2 * | 10/2006 | Avouris et al. | 257/103 |
| 7,714,386 B2 | 5/2010 | Pesetski et al. | |
| 8,093,113 B2 * | 1/2012 | Wang et al. | 438/158 |

(Continued)

OTHER PUBLICATIONS

Han, S., et al. "Graphene Technology With Inverted-T Gate and RF Passives on 200 MM Platform" 2011 IEEE International Electron Devices Meeting (IEDM). Dec. 2011. (4 Pages).

(Continued)

*Primary Examiner* — Jarrett Stark
*Assistant Examiner* — Shahed Ahmed
(74) *Attorney, Agent, or Firm* — Tutunjian & Bitetto, P.C.; Vazken Alexanian

(57) ABSTRACT

Transistors with self-aligned source/drain regions a gate structure embedded in a substrate; self-aligned source and drain contacts embedded in the substrate around the gate structure; and a channel layer over the gate structure and self-aligned source and drain contacts. The source and drain contacts extend above the channel layer.

6 Claims, 5 Drawing Sheets

(56) References Cited

U.S. PATENT DOCUMENTS

| | | |
|---|---|---|
| 8,124,463 B2 | 2/2012 | Chen et al. |
| 8,629,010 B2 * | 1/2014 | Avouris et al. ............... 438/161 |
| 2002/0063282 A1 * | 5/2002 | Lee ............... 257/330 |
| 2002/0064894 A1 * | 5/2002 | Lee ............... 438/30 |
| 2009/0236675 A1 | 9/2009 | Yang et al. |
| 2010/0102371 A1 | 4/2010 | Yeom |
| 2012/0292602 A1 * | 11/2012 | Guo et al. ............... 257/40 |
| 2013/0099204 A1 * | 4/2013 | Avouris et al. ............... 257/24 |

OTHER PUBLICATIONS

Han, S., et al. "Wafer Scale Fabrication of Carbon Nanotube FETs With Embedded Poly-Gates" 2010 IEEE International Electron Devices Meeting (IEDM). Dec. 2010. (4 Pages).

Franklin, A., et al. "Can Carbon Nanotube Transistors Be Scaled Without Performance Degradation?" 2009 IEEE International Electron Devices Meeting (IEDM). Dec. 2009. (4 Pages).

Franklin, A., et al. "Current Scaling in Aligned Carbon Nanotube Array Transistors With Local Bottom Gating" IEEE Electron Device Letters, vol. 31, No. 7. Jul. 2010. pp. 644-646.

* cited by examiner

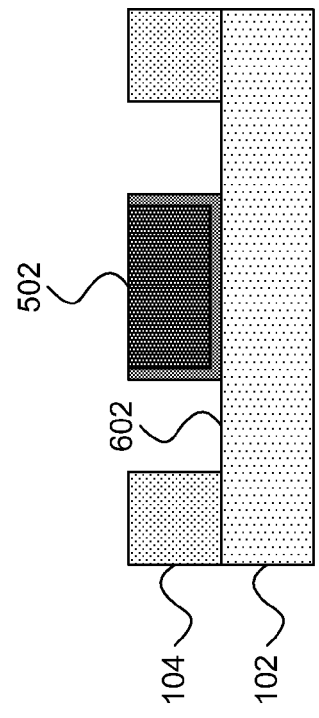
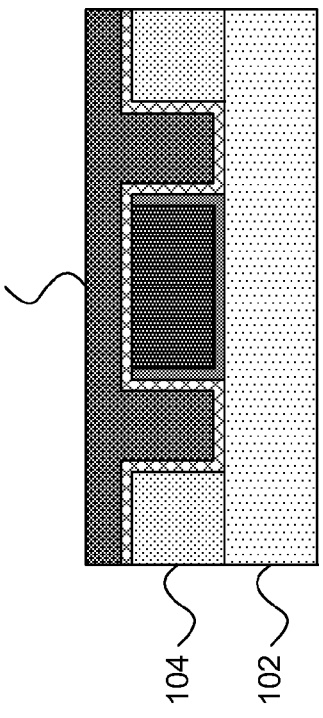
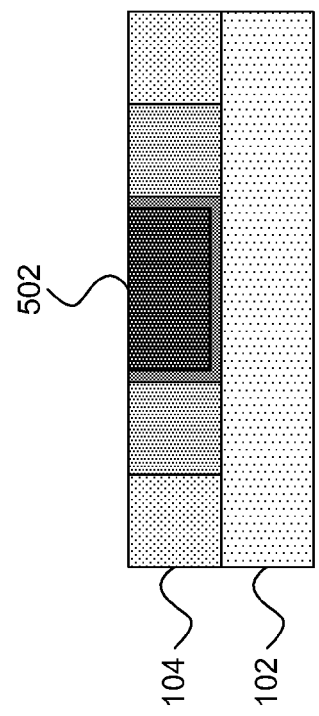
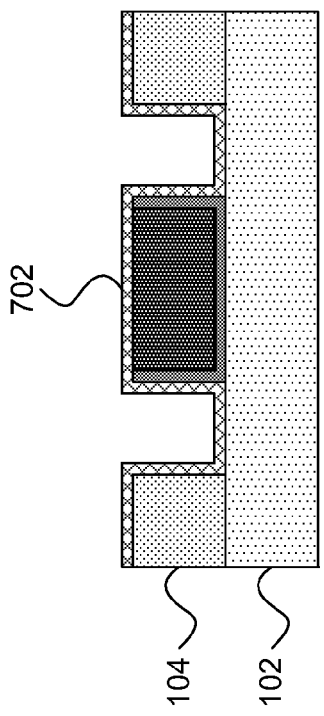

SELF ALIGNED EMBEDDED GATE CARBON TRANSISTORS

RELATED APPLICATION INFORMATION

This application is a Continuation application of co-pending U.S. patent application Ser. No. 13/864,760 filed on Apr. 17, 2013, incorporated herein by reference in its entirety.

BACKGROUND

1. Technical Field

The present invention relates to transistors and, more particularly, to self-aligned, embedded-gate field effect transistors.

2. Description of the Related Art

Carbon based low dimensional materials, including carbon nanotubes or graphene, are promising channel materials for future high-speed low-power nanoelectronics. Carbon channel materials offer superior electronic properties that are useful in ultra-scaled transistors, such properties including high carrier mobility and ultra-thin body. A popular approach to the construction of carbon-based transistors is to use a bottom gate electrode process flow, where the gate structure is formed before the carbon-based channel. This approach bypasses the use of seed layers for obtaining ultra-high quality gate dielectrics in carbon based devices.

However, conventional bottom-gate processes fail to provide self-alignment between contact electrodes and gate during source and drain formation. One negative effect of lacking self-alignment is that the distance between source/drain electrodes to the gate cannot be well controlled. This distance directly affects the access resistance of the device and the overall device performance.

SUMMARY

A method for forming a transistor includes forming a gate structure embedded in a recess in a substrate; removing substrate material around the gate structure to create self-aligned source and drain recesses; forming a channel layer over the gate structure and the source and drain recesses; and forming source and drain contacts in the source and drain recesses, wherein the source and drain contacts extend above the channel layer.

A method for forming a transistor includes forming a substrate; forming a gate structure embedded in a recess in the substrate; removing the second substrate material around the gate structure to create self-aligned source and drain recesses; forming a carbon-based channel layer over the gate structure and the source and drain recesses; and forming source and drain contacts in the source and drain recesses, wherein the source and drain contacts extend above the channel layer. Forming the substrate includes etching a first substrate material layer to form trenches; and depositing a second substrate material layer in the trenches to form dummy contacts that are separated and surrounded by the first material. Forming the gate structure includes removing the first substrate material separating the regions of the second substrate material to form a recess in the substrate; forming a nitride layer over the substrate and in the recess; depositing a gate material over the nitride layer; and polishing the gate material and nitride layer to remove any material outside the recess.

A transistor a gate structure embedded in a substrate; self-aligned source and drain contacts embedded in the substrate around the gate structure; and a channel layer over the gate structure and self-aligned source and drain contacts, wherein the source and drain contacts extend above the channel layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 5 is a cross-sectional view of a step in the formation of a self-aligned embedded gate transistor in accordance with the present principles;

FIG. 6 is a cross-sectional view of a step in the formation of a self-aligned embedded gate transistor in accordance with the present principles;

FIG. 7 is a cross-sectional view of a step in the formation of a self-aligned embedded gate transistor in accordance with the present principles;

FIG. 8 is a cross-sectional view of a step in the formation of a self-aligned embedded gate transistor in accordance with the present principles;

DETAILED DESCRIPTION OF PREFERRED EMBODIMENTS

Figure 1:
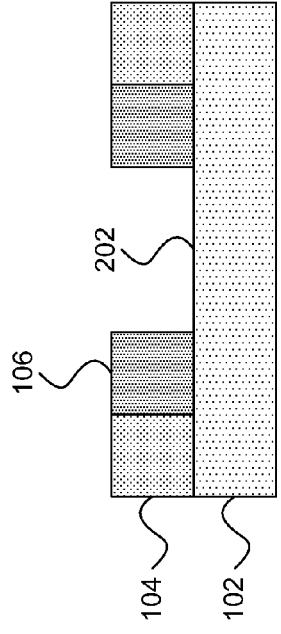
FIG. 1 is a cross-sectional view of a step in the formation of a self-aligned embedded gate transistor in accordance with the present principles.

The present principles provide self-alignment in the source and drain regions of a bottom gate carbon-based transistor.

Self-alignment is desirable for carbon-based transistor fabrication using a bottom gate structure. In a self-aligned structure, the gate structure itself is used to guide the placement of the source and drain regions.

The self-aligned contact is an important feature in current transistor technologies. When the device continues to scale to smaller sizes, the accuracy of the control of the distance from source/drain electrodes to the gate is beyond the capability of lithography tools. This distance determines the access resistance of the device, and if the self-alignment between source/drain electrodes and the gate is not achieved, the device performance variation will be too large to be useful.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a step in the formation of a self-aligned embedded gate transistor is shown. A substrate is formed and may be a bulk crystal substrate or may be a semiconductor-on-insulator substrate. A bulk crystal substrate may be formed from, e.g., a monolithic silicon crystal or any other appropriate material. A semiconductor-on-insulator substrate may include, for example, silicon on a base of silicon dioxide or any other appropriate material or combination of materials. As shown, the substrate includes an oxide layer 102 and semiconductor wells 106 that are divided by shallow trench isolation (STI) regions 104. Any appropriate STI process may be used, including, e.g., forming trenches in the oxide layer 102 and filling the trenches with semiconductor material 106. The oxide layer may be formed from any appropriate material including, e.g., silicon dioxide.

Figure 2:
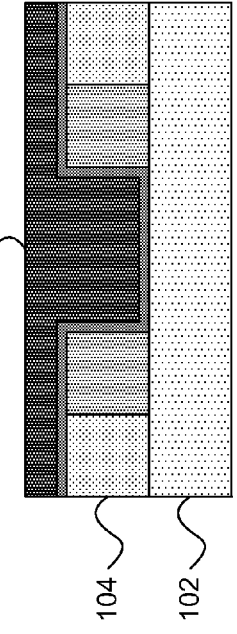
FIG. 2 is a cross-sectional view of a step in the formation of a self-aligned embedded gate transistor in accordance with the present principles.

Referring now to FIG. 2, a step in the formation of a self-aligned embedded gate transistor is shown. A recess 202 is formed by removing material from one of the STI regions 104 between two semiconductor regions 106. The recess 202 may be formed by any appropriate etch including, e.g., reactive ion etching (RIE).

Figure 3:
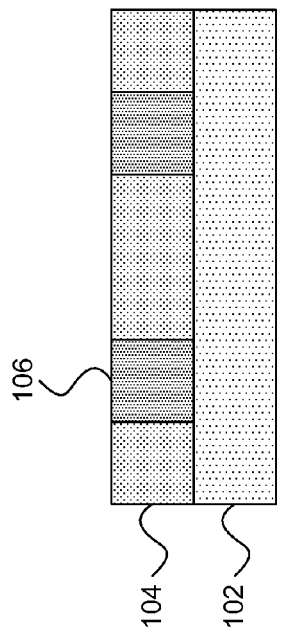
FIG. 3 is a cross-sectional view of a step in the formation of a self-aligned embedded gate transistor in accordance with the present principles.

Referring now to FIG. 3, a step in the formation of a self-aligned embedded gate transistor is shown. A nitride layer 302 is deposited using any appropriate deposition process including, e.g., chemical vapor deposition (CVD), atomic layer deposition (ALD), and physical vapor deposition (PVD). The nitride layer may be formed from, e.g., silicon nitride.

Figure 4:
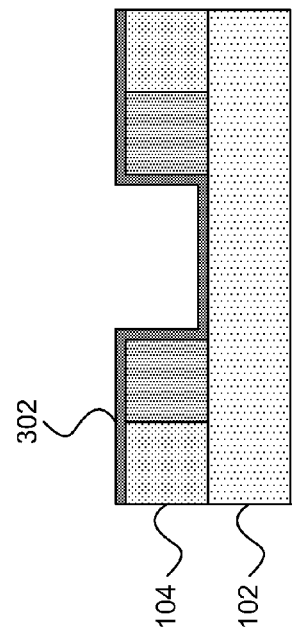
FIG. 4 is a cross-sectional view of a step in the formation of a self-aligned embedded gate transistor in accordance with the present principles.

Referring now to FIG. 4, a step in the formation of a self-aligned embedded gate transistor is shown. A metal layer 402 is deposited using any appropriate gate metal such as, e.g., tantalum, tantalum nitride, copper, tungsten, aluminum, etc. The metal layer 402 may be formed using any appropriate deposition process including, e.g., CVD, ALD, PVD, etc.

Referring now to FIG. 5, a step in the formation of a self-aligned embedded gate transistor is shown. A polishing step grinds the metal layer 402 down to form metal gate 502. It is contemplated that any appropriate polishing process may be used to accomplish this including, for example, chemical mechanical polishing. It is anticipated that those having ordinary skill in the art will be able to select an appropriate slurry to remove the excess metal and stop on, semiconductor regions 106 or STI regions 104.

Referring now to FIG. 6, a step in the formation of a self-aligned embedded gate transistor is shown. The semiconductor regions 106 are etched away using, e.g., a wet etch such as ammonium hydroxide or potassium hydroxide. This etch leaves recesses 602 around the gate 502 that will be used to form source/drain regions. In this way, the gate 502 is used to align the source and drain regions, establishing a self-aligned structure.

Referring now to FIG. 7, a step in the formation of a self-aligned embedded gate transistor is shown. A dielectric layer 702 is formed using any appropriate process including, e.g., CVD, ALD, PVD, etc. The dielectric layer 702 may include in particular a high-k dielectric such as, e.g., hafnium dioxide, hafnium silicate, zirconium dioxide, zirconium silicate, etc.

Referring now to FIG. 8, a step in the formation of a self-aligned embedded gate transistor is shown. A filler layer 802 is deposited using any appropriate process including, e.g., CVD, ALD, PVD, etc. The filler layer is specifically contemplated as being polysilicon, though any appropriate material may be used instead. After deposition, a polishing process such as CMP may be used to planarize the filler layer 802.

Figure 9:
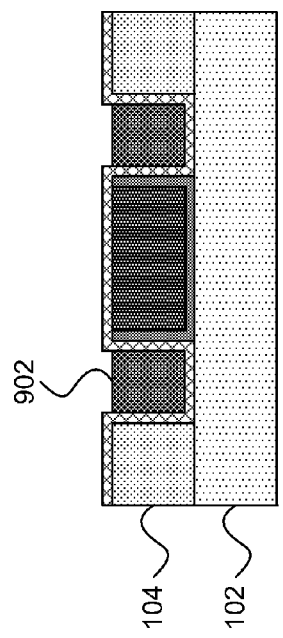
FIG. 9 is a cross-sectional view of a step in the formation of a self-aligned embedded gate transistor in accordance with the present principles.

Referring now to FIG. 9, a step in the formation of a self-aligned embedded gate transistor is shown. The filler layer 802 is etched down to below the level of the dielectric layer 702 using a wet etch. The wet etch should be selected in accordance with the material used for filler layer 802. In the example of a polysilicon filler layer 802, an ammonium hydroxide etch may be used. A remaining filler plug 902 remains in the source and drain regions 602 to protect the dielectric layer 702 from subsequent polishing processes. Because the dielectric layer 702 may be very thin (e.g., on the order of nanometers), it can easily be damaged during polishing. The filler layer 802 is etched below the level of the dielectric layer 702 to allow a suitable contact surface for the deposition of a channel layer in the next step.

Figure 10:
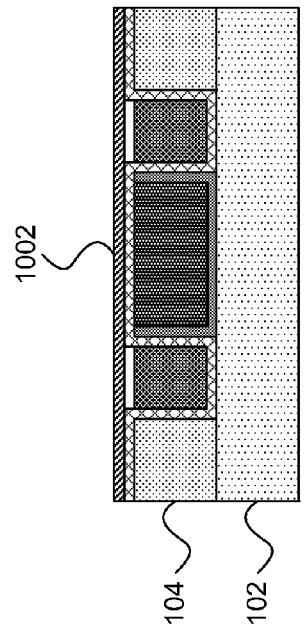
FIG. 10 is a cross-sectional view of a step in the formation of a self-aligned embedded gate transistor in accordance with the present principles.

Referring now to FIG. 10, a step in the formation of a self-aligned embedded gate transistor is shown. A channel layer 1002 is formed on the dielectric layer 702. The channel layer 1002 may be formed from, e.g., a suitable carbon channel material such as, e.g., carbon nanotubes, graphene, etc. Such carbon channel materials may be made very thing one molecule or one atom (in the case of graphene) thick. Carbon channel materials can operate at room temperature and at low threshold voltages, making them well suited to small-device-size, low-power applications. In addition, electrons move faster within carbon-based channel materials, decreasing the switching time of the device.

The channel layer 1002 may be formed off-chip and transferred to the surface of dielectric layer 702. For example, sheets of graphene or arrays of carbon nanotubes may be formed in a CVD process on a transfer material. The transfer material may then be used to apply the channel material 1002 to the dielectric layer 702. This transfer allows the channel material 7002 to be formed under more precise conditions, as a CVD process would have difficulty forming high-quality carbon channel material over, e.g., the recessed filler material 902.

Figure 11:
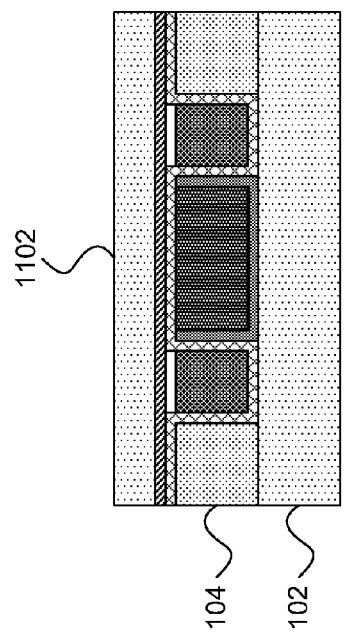
FIG. 11 is a cross-sectional view of a step in the formation of a self-aligned embedded gate transistor in accordance with the present principles.

Referring now to FIG. 11, a step in the formation of a self-aligned embedded gate transistor is shown. A dielectric layer 1102 is formed over the channel layer 1002. The dielectric layer 1102 may be deposited using any appropriate process including, e.g., CVD, ALD, PVD, etc., and may be formed from, e.g., silicon dioxide.

Figure 12:
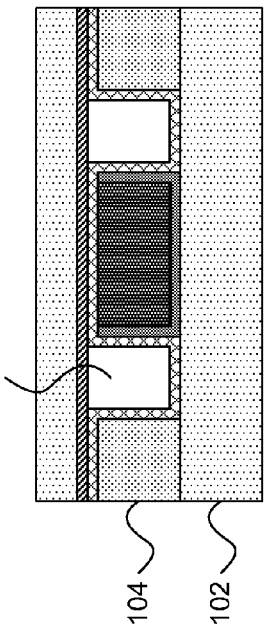
FIG. 12 is a cross-sectional view of a step in the formation of a self-aligned embedded gate transistor in accordance with the present principles.

Referring now to FIG. 12, a step in the formation of a self-aligned embedded gate transistor is shown. Contact areas 1202 are etched from above. The dielectric layer 1102 is etched using, e.g., an RIE process to provide access holes to the filler layer 802 below. The filler layer 802 is then removed, leaving source/drain regions 1202. The filler layer 802 may be removed using any appropriate process including, e.g., an ammonium hydroxide or potassium hydroxide wet etch.

Figure 13:
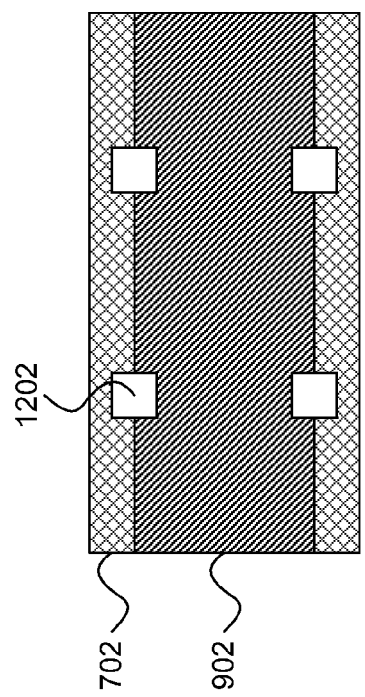
FIG. 13 is a top-down view of a step in the formation of a self-aligned embedded gate transistor in accordance with the present principles.

Referring now to FIG. 13, a top-down view of the formation of source/drain regions 1202 is shown. After access holes are etched in the dielectric layer 1102 (not shown) and the channel layer 1002, the source/drain regions 1202 are exposed, though still filled with filler layer 802. The filler layer 802 is then easily removed using a wet etch that fills the source/drain regions 1202.

Figure 14:
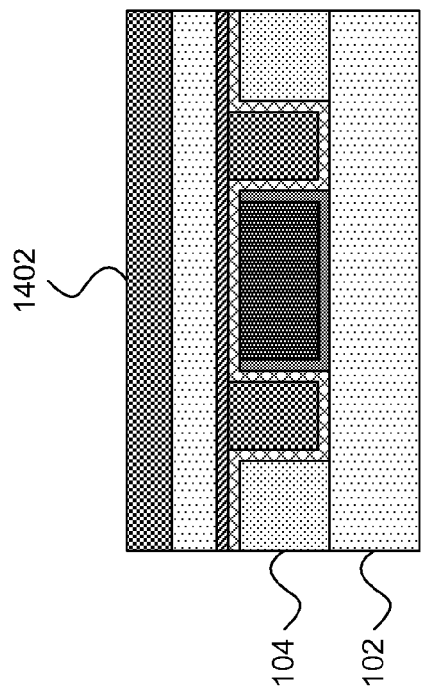
FIG. 14 is a cross-sectional view of a step in the formation of a self-aligned embedded gate transistor in accordance with the present principles.

Referring now to FIG. 14, a step in the formation of a self-aligned embedded gate transistor is shown. A contact material 1402 such as, e.g., palladium or other appropriate metal or conductive composite, is deposited over the dielectric layer 1102 and in the source/drain regions 1202. The contact material 1402 may be deposited using any appropriate process such as, e.g., CVD, ALD, PVD, etc. If a conductive compound, such as a carbide is used, a first material may be deposited and subsequently mixed with carbon to form contacts. For example, a transition metal such as molybdenum or tungsten may be deposited. During an anneal step, the metal reacts with the carbon to form a conductive carbide.

Figure 15:
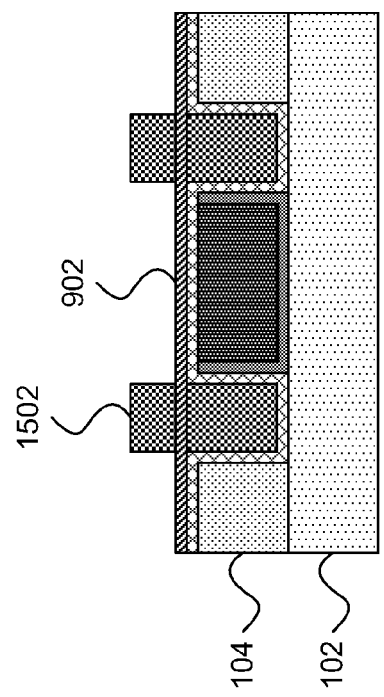
FIG. 15 is a cross-sectional view of a step in the formation of a self-aligned embedded gate transistor in accordance with the present principles.

Referring now to FIG. 15, a step in the formation of a self-aligned embedded gate transistor is shown. A polishing process such as, e.g., CMP, may be used to polish the contact material 1402 down to the level of the dielectric layer 1102. The dielectric layer 1102 may then be removed using any appropriate etch such as, e.g., a wet etch, to expose the channel layer 1002 and the remaining contact material. The remaining contact material 1502 protrudes above the level of the channel layer 1002 to form source/drain contacts.

Figure 16:
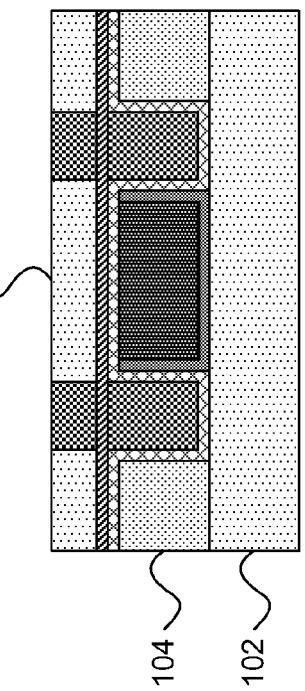
FIG. 16 is a cross-sectional view of a step in the formation of a self-aligned embedded gate transistor in accordance with the present principles.

Referring now to FIG. 16, a step in the formation of a self-aligned embedded gate transistor is shown. A passivation layer 1602 is deposited over the channel layer 1002 using any appropriate deposition process including, e.g., CVD, ALD, PVD, etc. The passivation layer 1602 may be formed from any appropriate insulator including, e.g., silicon dioxide or silicon nitride, and should be thick enough to provide adequate protection to the underlying components.

Figure 17:
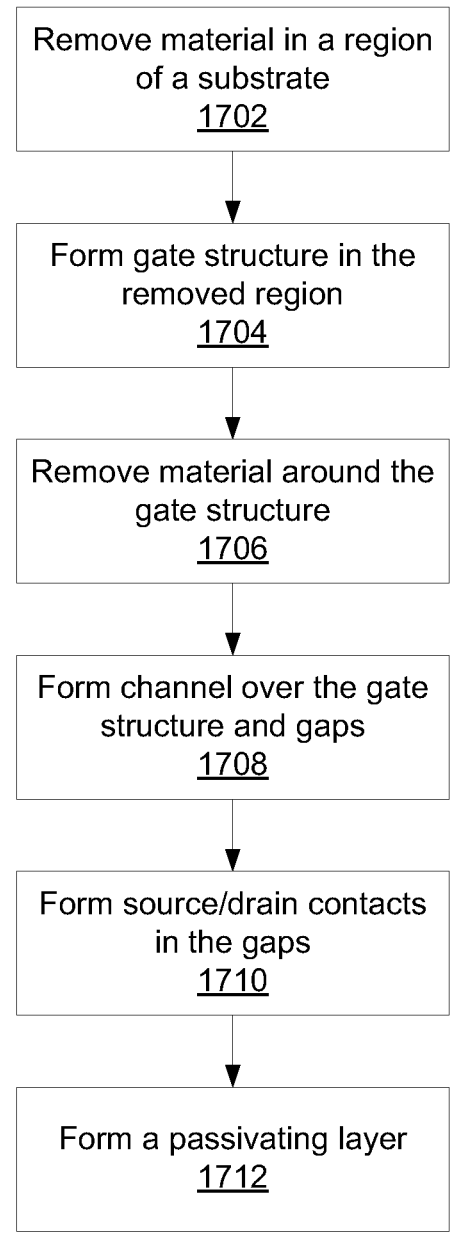
FIG. 17 is a block/flow diagram of a method for forming a self-aligned embedded gate transistor in accordance with the present principles.

Referring now to FIG. 17, a method for forming a self-aligned embedded-gate transistor is shown. Block 1702 removes material in a region of a substrate. In the embodiment set forth above, this includes defining STI regions 104 in a semiconductor layer 106 and removing the material in recess 202 such that structures of semiconductor material 106 remain around the recess 202.

Block 1704 forms a gate structure in the recess 202. This includes depositing a nitride layer 302 and gate material 402, excess material from which is removed to form gate 502. Block 1706 then removes the remaining semiconductor material 106 from around the gate structure, thereby providing self-aligned space 602 for the formation of source/drain regions. The spaces 602 may further be lined with a high-k dielectric layer 702 to protect them from subsequent etch processes.

Block 1708 forms a channel layer 1002 over the gate 502 and the spaces 602. As noted above, this channel material 1002 may be an appropriate carbon-based channel structure including, e.g., carbon nanotubes or graphene. Block 1710 forms source/drain contacts 1502 in the spaces 602. The contacts may be formed by etching contact area holes in the overlying layers and removing any remaining material in the spacers 602 before depositing a conductive source/drain contact metal 1402. The contact metal 1402 is trimmed to leave only the contact pads of source/drain contacts 1502 exposed above the channel layer 1002. In one embodiment, the removal of excess contact metal 1402 stops on a dielectric layer 1102, such that the source/drain contacts 1502 extend above the surface of the channel layer 1002 after removal of the dielectric layer 1102. Block 1712 forms a passivation layer 1602 over the channel layer 1002, protecting the channel layer 1002. The passivation layer 1602 is formed to allow access to source/drain contacts 1502 by, e.g., depositing a thickness of passivation material that is suitable to protect the underlying components without covering the source and drain contacts 1502. Alternatively, a thicker passivation layer 1602 may deposited and subsequently etched to provide electrical access to the source and drain contacts 1502.

Having described preferred embodiments of self-aligned embedded-gate carbon transistors and methods for making the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A transistor, comprising:
   a gate structure embedded in a substrate;
   self-aligned source and drain contacts embedded in the substrate around the gate structure; and
   a channel layer over the gate structure and self-aligned source and drain contacts, said channel layer comprising source/drain access holes over the respective source and drain contacts to allow access to said source and drain contacts, wherein the source and drain contacts extend above the channel layer.

2. The transistor of claim 1, wherein the channel layer comprises a carbon-based channel material.

3. The transistor of claim 1, wherein the gate structure comprises:
   a nitride layer formed in a recess of the substrate;
   a metal gate formed over the nitride layer; and
   a dielectric layer formed over the metal gate and nitride layer.

4. The transistor of claim 1, wherein the substrate is an oxide that surrounds the gate structure and source and drain regions.

5. The transistor of claim 1, wherein the gate structure and the self-aligned source and drain contacts are on a same side of the channel layer.

6. The transistor of claim 1, further comprising a passivation layer over the channel layer that protects the channel layer, wherein the source and drain contacts are accessible through the passivation layer.

* * * * *